United States Patent
Corbe et al.

(10) Patent No.: US 9,344,068 B2
(45) Date of Patent: May 17, 2016

(54) DEVICE FOR GENERATING SHORT ELECTRICAL PULSES

(71) Applicant: VEGA GRIESHABER KG, Wolfach (DE)

(72) Inventors: Bernhard Corbe, Schutterwald (DE); Michael Fischer, Alpirsbach (DE)

(73) Assignee: Vega Grieshaber KG, Wolfach (DE)

( * ) Notice: Subject to any disclaimer, the term of this patent is extended or adjusted under 35 U.S.C. 154(b) by 599 days.

(21) Appl. No.: 13/768,367

(22) Filed: Feb. 15, 2013

(65) Prior Publication Data

US 2014/0062217 A1    Mar. 6, 2014

(30) Foreign Application Priority Data

Feb. 15, 2012 (EP) .................................. 12155675

(51) Int. Cl.
*H03K 3/57* (2006.01)
*H03K 3/36* (2006.01)
*H03K 5/04* (2006.01)
*H03K 5/08* (2006.01)

(52) U.S. Cl.
CPC .. *H03K 3/36* (2013.01); *H03K 5/04* (2013.01); *H03K 5/08* (2013.01)

(58) Field of Classification Search
CPC ............. H03K 3/45; H03K 3/53; H03K 3/55; H03K 3/57; H03K 3/537; H03K 3/84; H03K 5/04; H03K 5/08; H03B 5/18
USPC .................................................. 307/106, 266
See application file for complete search history.

(56) References Cited

U.S. PATENT DOCUMENTS

| | | | |
|---|---|---|---|
| 3,867,648 A | 2/1975 | Christenson | |
| 6,380,815 B1 * | 4/2002 | Fehrenbach | G01S 7/282 331/117 D |
| 6,771,139 B2 * | 8/2004 | Schultheiss | H03K 5/06 331/117 D |
| 2003/0076136 A1 * | 4/2003 | McCorkle | H03K 5/05 327/112 |
| 2005/0093601 A1 * | 5/2005 | Gerding | H03K 5/07 327/164 |
| 2007/0296384 A1 | 12/2007 | Dow et al. | |

FOREIGN PATENT DOCUMENTS

| | | |
|---|---|---|
| EP | 1 528 679 | 9/2004 |
| JP | 57/204926 | 12/1982 |

* cited by examiner

*Primary Examiner* — Thienvu Tran
*Assistant Examiner* — David M Stables
(74) *Attorney, Agent, or Firm* — Juneau & Mitchell

(57) ABSTRACT

A device for the generation of short electric pulses, comprising a base generator for the generation of base monocycle pulses, wherein the base generator is followed by a transistor stage 4.

13 Claims, 2 Drawing Sheets

DEVICE FOR GENERATING SHORT ELECTRICAL PULSES

CROSS REFERENCE TO RELATED APPLICATIONS

This patent application claims priority to European Patent Application 12 155 675.7, filed on Feb. 15, 2012.

STATEMENT REGARDING FEDERALLY SPONSORED RESEARCH OR DEVELOPMENT

No federal government funds were used in researching or developing this invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

1. Field of the Invention

The invention relates to a device for the generation of short electric pulses.

Devices for the generation of short electric pulses typically have a master generator for the generation of base monocycle pulses, wherein a base monocycle pulse can be tapped at the output thereof.

The problem addressed by the present invention is that of providing an advanced pulse generator which generates the shortest and most Gaussian-shaped monocycle pulses possible, wherein these are characterized by very low overshoot.

2. Background of the Invention

The current state of knowledge is as follows.

The object of the invention is a device for the generation of short electric pulses comprising a master generator for the generation of base monocycle pulses in the sub-nanosecond range, wherein a transistor stage is connected behind the master generator.

The invention is a component capable of producing ultra-short electric pulses, a highly sought-after feature in many electrical devices, at an affordable price.

BRIEF SUMMARY OF THE INVENTION

In a preferred embodiment, [COPY CLAIMS].

DETAILED DESCRIPTION OF THE INVENTION

Figure 1:
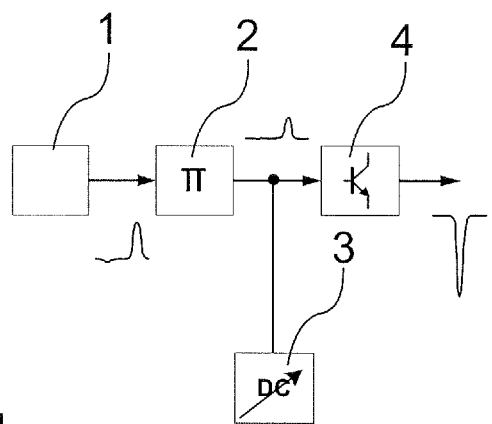
FIG. 1 is a line drawing evidencing the pulse device.

Herein provided is a device according to the invention for the generation of short electric pulses, comprising a master generator for the generation of base monocycle pulses in the sub-nanosecond range, wherein a transistor stage is connected behind the master generator.

By way of example, a pulse generator which provides short monocycle pulses—that is, unipolar voltage pulses in the sub-nanosecond range—at the output thereof can be included as the base generator. A transistor stage is then connected behind the base generator for the purpose of generating a further shortened electric pulse, and this transistor stage is preferably operated in common emitter mode. In this way, it is possible to take advantage of the high current gain of a bipolar transistor operated in common emitter mode.

In addition, the use of an active switch element can also prevent the signal amplitude of the electrical pulse generated at the output of this circuit from dropping.

In order to further shorten the electrical pulse which can be obtained at the output, an attenuator can be connected before the transistor stage.

A base monocycle pulse, which is fed to the transistor stage, can be tapped at the output of this attenuator. The provision of the attenuator achieves a configuration wherein only a certain part of the base monocycle pulse contributes to the output voltage of the transistor. Relative to the pulse width of the base monocycle pulse, a current flows for a shorter time in the base emitter diode of the following transistor stage. This reduction of the current wave angle results in an increase of the harmonic wave fraction in the nonlinear characteristic curve of the transistor, and therefore a shortening of the pulse width. The attenuator can also suppress undesired overshoot and undershoot of the base monocycle pulse from the base generator. By way of example, the attenuator can be designed as a pi- or T-element, or as a voltage divider.

The transistor stage can be operated with a bias voltage.

By way of example, a direct current source can be included for biasing the transistor stage. The direct current source can be connected to the base terminal of the transistor stage, for example, such that the direct current and the attenuated base monocycle pulse are fed superimposed to the transistor stage.

The direct current and the attenuated base monocycle pulse are preferably tuned to each other in such a manner that the transistor stage is particularly not saturated by the sum of the direct current and the attenuated base monocycle pulse. The polarity of the direct current can be positive or negative, wherein a positive direct current is kept sufficiently low such that no collector current flows without a base monocycle pulse.

In one implementation of the device according to the invention, the bias voltage of the transistor stage can be adjusted.

By means of the adjustability of the bias voltage, the configuration can particularly compensate for manufacturing tolerances. In addition, adjustability of the bias voltage makes it possible to adjust a desired width or amplitude of the output pulse. The pulse generator according to the invention is therefore significantly more flexible in application than the generators known in the prior art.

By way of example, to adjust the bias voltage, an adjustment device can be included on the direct voltage source. By way of example, this adjustment device can be designed as a digital to analog converter or as an analog to digital potentiometer. In this manner, the configuration makes possible a manual adjustment of the bias voltage, but can also implement a fully automatic adjustment based on a provided control signal.

In order to make it possible to compensate not only for variations due to manufacturing, but also temperature-induced changes, a temperature compensation device can be included.

The temperature compensation device is preferably designed in such a manner that it adjusts the direct current source in such a manner that a temperature variation in the device is compensated.

The temperature compensation device can particularly have a thermistor for this purpose, such that the transistor stage is biased with a temperature-dependent direct current voltage. As an alternative, however, temperature-dependent direct current voltages can be fed in by means of digital potentiometers or D/A converters for the purpose of compensating for a temperature deviation. In particular, the temperature compensation device can affect the analog to digital potentiometer in such a manner that a direct current voltage which is matched to the temperature variation of the device is fed to the transistor stage.

The transistor stage can also be followed by a derivative element and a clipping device. The output pulse obtained in this manner will then have a reduced amplitude compared to the pulse which can be tapped at the transistor stage, but will be narrower overall. The ratio of narrowness to amplitude of the pulse is therefore improved compared to the prior art.

DETAILED DESCRIPTION OF THE FIGURES

Turning now to the Figures, FIG. 1 shows a first embodiment of a device according to the invention for the generation of short electric pulses, meaning unipolar voltage pulses which are substantially Gaussian in shape, having a base generator 1 for the purpose of generating base monocycle pulses in the sub-nanosecond range.

As mentioned above, this construction of the base generator 1 is only intended as one example. In principle, any pulse generator can be used as the base generator 1 which provides unipolar electric pulses in the sub-nanosecond range at the output thereof.

The output pulse of the base generator 1 substantially determines the pulse width of the entire circuit. If it supplies pulses in the sub-nanosecond range, then the output pulses of the entire arrangement will also be in this range. The measured additional pulse shortening is along the order of magnitude of 30%.

In the present embodiment, the base generator 1 is followed by an attenuator 2 which attenuates the base monocycle pulse tapped at the base generator in such a manner that only the upper part of the base monocycle pulse is effective at the output. The attenuator 2 can be designed as a resistive pi element, T element, or as a simple voltage divider, for example. In principle, any circuit network is suitable which attenuates the base monocycle pulse generated in the base generator to such a degree that only the narrow and steep pulse peak contributes to the controlling of a transistor stage 4. A further advantage of the use of an attenuator element 2 is that undesirable signal fractions, such as overshoot or undershoot resulting from parasitic capacitance and inductance in the circuit structure, for example, are suppressed.

The attenuation of the base monocycle pulse by means of the attenuator element 2 makes it possible to further reduce the current wave angle available for controlling the following transistor stage. In order to ensure a reliable control of the transistor stage 4, and to make it possible to adjust the desired output amplitude and/or pulse width, a direct current from a direct current voltage source 3 is superimposed on the attenuated base monocycle pulse. The direct current voltage is adjusted in such a manner that no collector current flows in the transistor stage 4 without the superimposition on the attenuated base monocycle pulse.

By means of the superimposition of the direct current voltage with the attenuated base monocycle pulse, both the amplitude and the current wave angle of the control pulse are modified according to the height of the direct current voltage, thereby resulting in a way of controlling the output pulses.

As shown in the present embodiment, the direct current voltage source 3 is preferably designed to be adjustable, such that it is possible to customize the direct current voltage to manufacturing-based variations or to a temperature variation in the device. Moreover, it is possible by means of varying the direct current voltage at the input of the transistor stage 4 to make an output amplitude and/or pulse width adjustable in such a manner that it is possible to achieve an adjustment range between minimal and maximum amplitudes with a factor>3. In addition, it is possible to compensate for the temperature variation in the circuit. To this end, a thermistor with a resistor network which acts directly on the applied direct current voltage, or a regulator device, can be included. Such a regulator device detects the output amplitude and functions to correct the direct current voltage, for example via a digital potentiometer.

Figure 2:
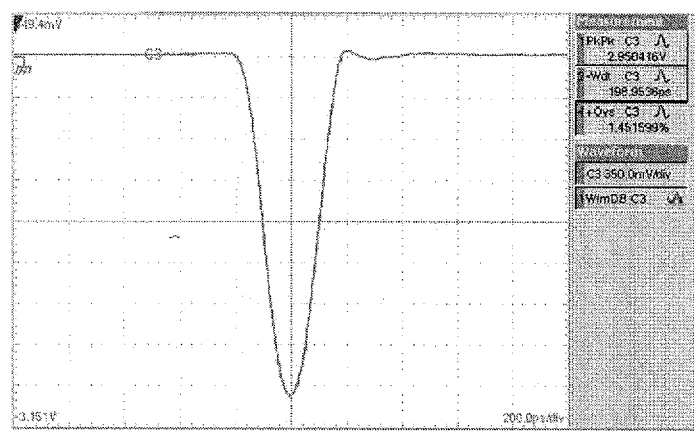
FIG. 2 is a line drawing evidencing a measurement of the output pulse of the device according to the invention.

FIG. 2 shows a measured output pulse of the described method, wherein the pulse width has been scaled to approx. 200 ps. At an output amplitude of approximately 3 V, the overshoot is <1.5%, corresponding to attenuation of approximately 36 dB.

Figure 3:
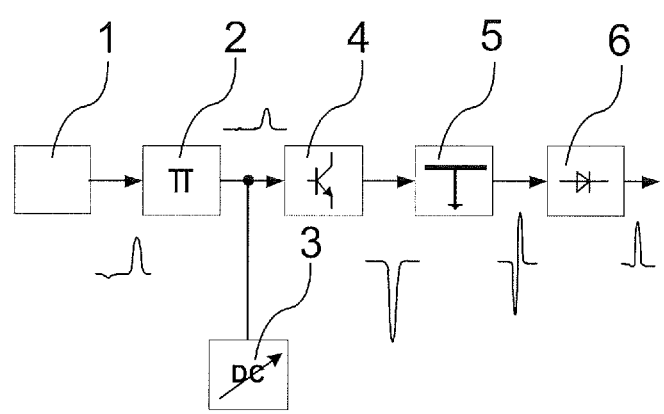
FIG. 3 is a line drawing evidencing one implementation of the embodiment shown in FIG. 1.

FIG. 3 shows one implementation of the circuit shown in FIG. 1.

In the embodiment shown in FIG. 3, the transistor stage 4 is followed by a derivative stage 5 and a clipping device 6 on the output thereof. The derivative stage 5 generates an electric pulse from the output signal tapped at the transistor stage 4, said electric pulse having a further shortened pulse width, but being bipolar due to the characteristics of the derivative stage 5. In order to once again obtain a monocycle pulse from this bipolar electric pulse, the derivative stage 5 is followed by the clipping device 6, which is designed as a Schottky diode, by way of example.

LIST OF REFERENCE NUMBERS 1 base generator
2 attenuator element
3 direct current voltage source
4 transistor stage
5 derivative stage
6 clipping device The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable Equivalents.

We claim:

1. A device for generation of short electric pulses, comprising a base generator for the generation of base monocycle pulses, characterized in that a transistor stage follows the base generator, wherein
the transistor stage follows an attenuator element and an attenuated base monocycle pulse can be tapped at the output thereof,
the transistor stage is operated with a bias voltage, a direct current voltage source is included for the purpose of biasing the transistor stage, and the direct current voltage and the attenuated base monocycle pulse are matched to each other in such a manner that the transistor stage is particularly not saturated by the sum of the direct current and the attenuated base monocycle pulse.

2. The device of claim 1, further comprising wherein the direct current voltage source is applied at a base terminal of the transistor stage.

3. The device of claim 2, further comprising wherein the direct current voltage source can be adjusted via an adjustment device.

4. The device of claim 3, further comprising wherein the adjustment device is designed as a digital to analog converter.

5. The device of claim 3, further comprising wherein the adjustment device is designed as an analog to digital potentiometer.

6. The device of claim 1, wherein the configuration further comprises a temperature compensation device.

7. The device of claim 6, further comprising wherein the temperature compensation device adjusts the direct current voltage in such a manner that a temperature variation of the device is compensated.

8. The device of claim 7, wherein the temperature compensation device further comprises a thermistor.

9. The device of claim 7, further comprising wherein the compensation device acts on an analog or digital potentiometer.

10. The device of claim 1, wherein the transistor stage is followed by a derivative element and a clipping device.

11. The device of claim 10, further comprising wherein the clipping device is designed as a Schottky diode.

12. The device of claim 1, wherein the attenuator element is designed as a pi element, a T element, or as a voltage divider.

13. The device of claim 1, further comprising wherein the bias voltage can be adjusted.

* * * * *